United States Patent
Basol et al.

(10) Patent No.: US 6,946,066 B2
(45) Date of Patent: *Sep. 20, 2005

(54) MULTI STEP ELECTRODEPOSITION PROCESS FOR REDUCING DEFECTS AND MINIMIZING FILM THICKNESS

(75) Inventors: Bulent M. Basol, Manhattan Beach, CA (US); Cyprian E. Uzoh, Milpitas, CA (US); Homayoun Talieh, San Jose, CA (US)

(73) Assignee: ASM Nutool, Inc., Fremont, CA (US)

( * ) Notice: Subject to any disclaimer, the term of this patent is extended or adjusted under 35 U.S.C. 154(b) by 497 days.

This patent is subject to a terminal disclaimer.

(21) Appl. No.: 10/201,604

(22) Filed: Jul. 22, 2002

(65) Prior Publication Data

US 2003/0038038 A1 Feb. 27, 2003

Related U.S. Application Data

(60) Provisional application No. 60/306,758, filed on Jul. 20, 2001.

(51) Int. Cl.⁷ .............................. C25D 5/02; C25D 5/06; C25D 5/00; C25D 5/48; H01L 21/44
(52) U.S. Cl. ................ 205/118; 205/117; 205/123; 205/137; 205/223; 438/675; 438/687
(58) Field of Search .......................... 205/117, 118, 205/123, 137, 223; 428/304.4, 312.8, 675, 687

(56) References Cited

U.S. PATENT DOCUMENTS

| | | | |
|---|---|---|---|
| 6,176,992 B1 | 1/2001 | Talieh | 205/87 |
| 6,270,647 B1 | 8/2001 | Graham et al. | 205/99 |
| 6,319,384 B1 * | 11/2001 | Taylor et al. | 205/103 |
| 6,548,395 B1 * | 4/2003 | Woo et al. | 438/622 |
| 6,709,970 B1 * | 3/2004 | Park et al. | 438/620 |
| 6,750,144 B2 * | 6/2004 | Taylor | 438/678 |
| 2003/0015435 A1 * | 1/2003 | Volodarsky et al. | 205/640 |
| 2003/0119311 A1 * | 6/2003 | Basol et al. | 438/678 |
| 2004/0012090 A1 * | 1/2004 | Basol et al. | 257/755 |

FOREIGN PATENT DOCUMENTS

| | | |
|---|---|---|
| JP | 2000208443 | 7/2000 |
| WO | WO 01/32362 | 5/2001 |

OTHER PUBLICATIONS

Reid et al., "Factors influencing damascene feature fill using copper PVD and electroplating," *Solid State Technology*, Jul. 2000, pp. 86–103.

* cited by examiner

*Primary Examiner*—Edna Wong
(74) *Attorney, Agent, or Firm*—Knobbe Martens Olson & Bear LLP

(57) ABSTRACT

The present invention relates to a method for forming a planar conductive surface on a wafer. In one aspect, the present invention uses a no-contact process with electrochemical deposition, followed by a contact process with electrochemical mechanical deposition.

22 Claims, 8 Drawing Sheets

MULTI STEP ELECTRODEPOSITION PROCESS FOR REDUCING DEFECTS AND MINIMIZING FILM THICKNESS

This application is related to and claims the benefit of and priority to U.S. Provisional Application No, 60/306,758 filed on Jul. 20, 2001 entitled "Multi Step Electrodeposition Process For Reducing Defects and Minimizing Film Thickness."

BACKGROUND OF THE INVENTION

1. Field of the Invention

The present invention generally relates to semiconductor processing technologies and, more particularly, to an electrodepositing process that deposits thin and planar layers.

2. Description of the Related Art

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can also be electrically connected using vias or contacts. A conductive material filling process of such features, i.e., via openings, trenches, dual damascene structures, pads or contacts can be carried out by depositing a conductive material over the substrate including such features.

Copper and copper alloys have recently received considerable attention as interconnect materials because of their superior electromigration and low resistivity characteristics. Electrodeposition is typically used to deposit copper into the features on the wafer surface. In the prior art, however, after performing the material deposition to fill such features or cavities, a variation in the thickness of the deposited copper material inevitably occurs on the surface of the substrate. The excess copper on the wafer surface is called overburden. The conventional deposition methods produce a thick overburden with a surface with large variations across the wafer.

An etching, an electropolishing/electroetching or a chemical mechanical polishing (CMP), or other material removal steps may be employed to remove the overburden and planarize the surface. Such processes remove the conductive material overburden off the surface of the wafer, particularly the field regions, thereby leaving the conductive materials primarily disposed within the features, such as vias, trenches and the like. However, the planarization and the removal of the large overburden resulting from the conventional deposition methods is expensive and time consuming. Furthermore, large variations on the non-planar surface of the overburden result in defects such as dishing and erosion, after the overburden removal and planarization steps.

To this end, there is a need for a process for forming conductive layers with planar surface and minimum thickness of the overburden layer.

SUMMARY OF THE INVENTION

The present invention relates to an apparatus and method for forming a planar and thin layer on a front surface of a workpiece. The apparatus according to the present invention includes an electrode and a workpiece surface influencing device, also referred to as a mask plate, disposed in between the electrode and the front surface of the workpiece. The workpiece surface influencing device preferably includes at least one channel for allowing a plating solution to flow from the electrode to the front surface of the workpiece. The channel also includes an open end for allowing the plating solution to flow out of the workpiece surface influencing device.

The method according to the present invention includes positioning the front surface of the workpiece in close proximity to the workpiece surface influencing device. Thereafter, the plating solution containing the conductive material is flowed to the front surface of the workpiece through the channel in the workpiece surface influencing device. An electric potential is applied between the workpiece and the electrode both of which are in physical contact with the plating solution, thereby allowing a conductive material to be formed on the front surface of the workpiece using an electrochemical deposition process. In a subsequent electrochemical mechanical deposition process, the front surface of the workpiece is then swept or polished using a top surface of the workpiece surface influencing device as an electric potential is applied. In the next step, an electric potential having a polarity opposite the electric potential used in the electrochemical deposition process and the electrochemical mechanical deposition process is applied to the workpiece and the electrode.

BRIEF DESCRIPTION OF THE DRAWINGS

The above and other features and advantages of the invention are further described in the detailed description which follows, with reference to the drawings by way of non-limiting exemplary embodiments of the invention, wherein like reference numerals represent similar parts of the invention throughout several views and wherein.

DETAILED DESCRIPTION OF THE PREFERRED EMBODIMENTS

Figure 1:
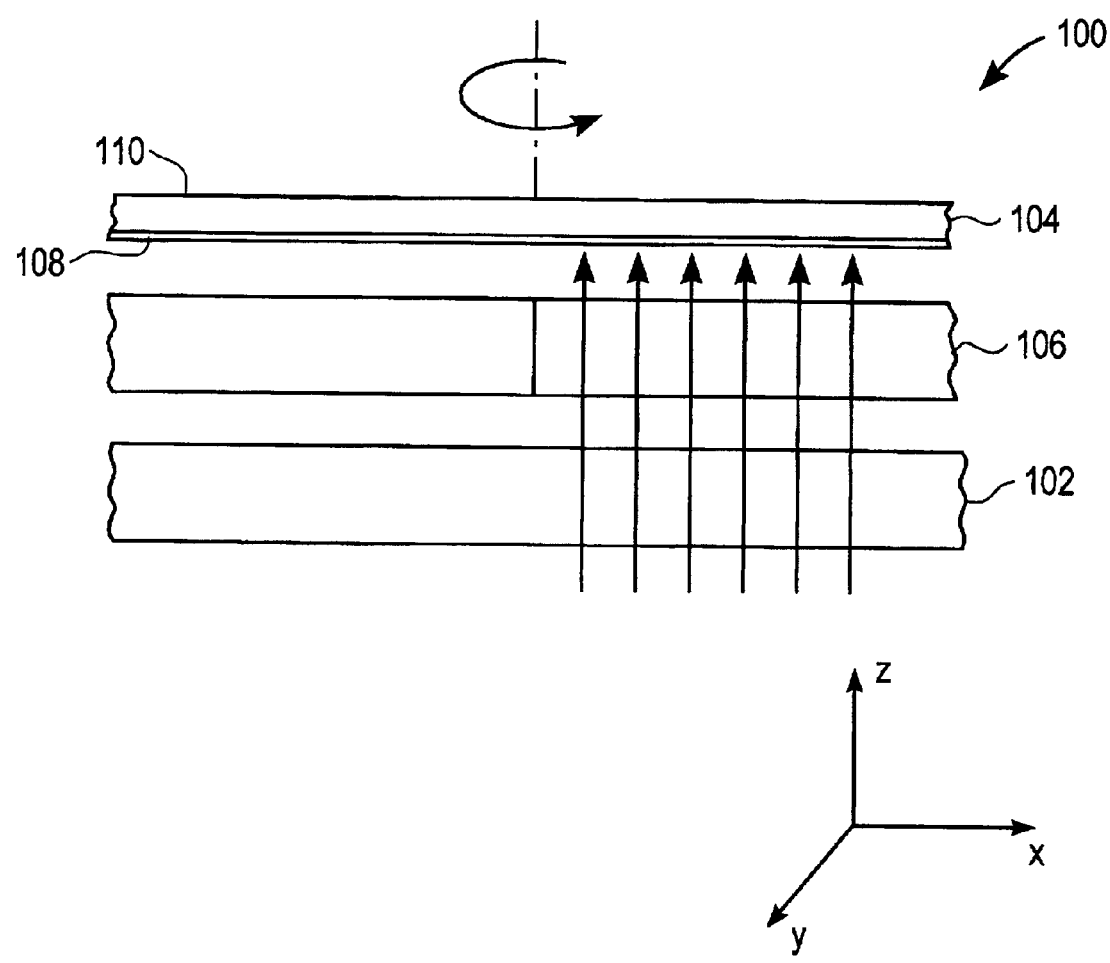
FIG. 1 schematically shows a portion of exemplary electro plating/etching system that may be used for the present invention.
Figure 2:
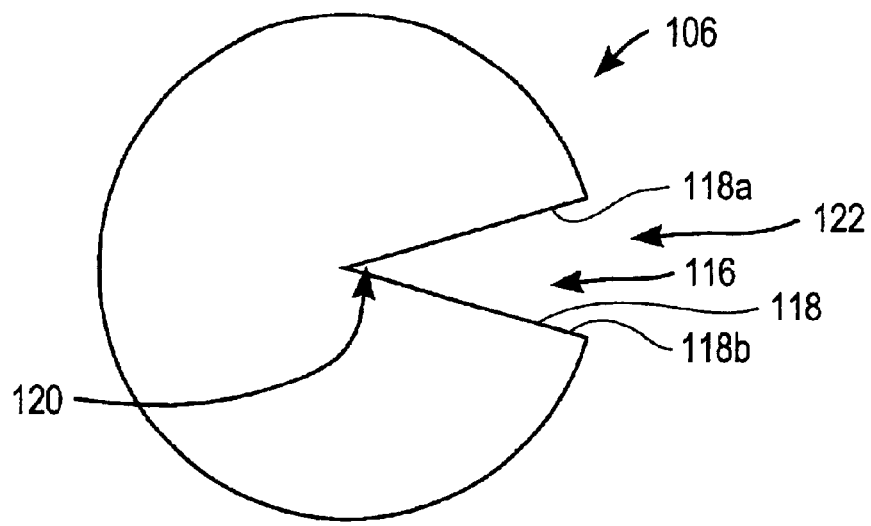
FIG. 2 illustrates a top view of a mask plate.
Figure 3:
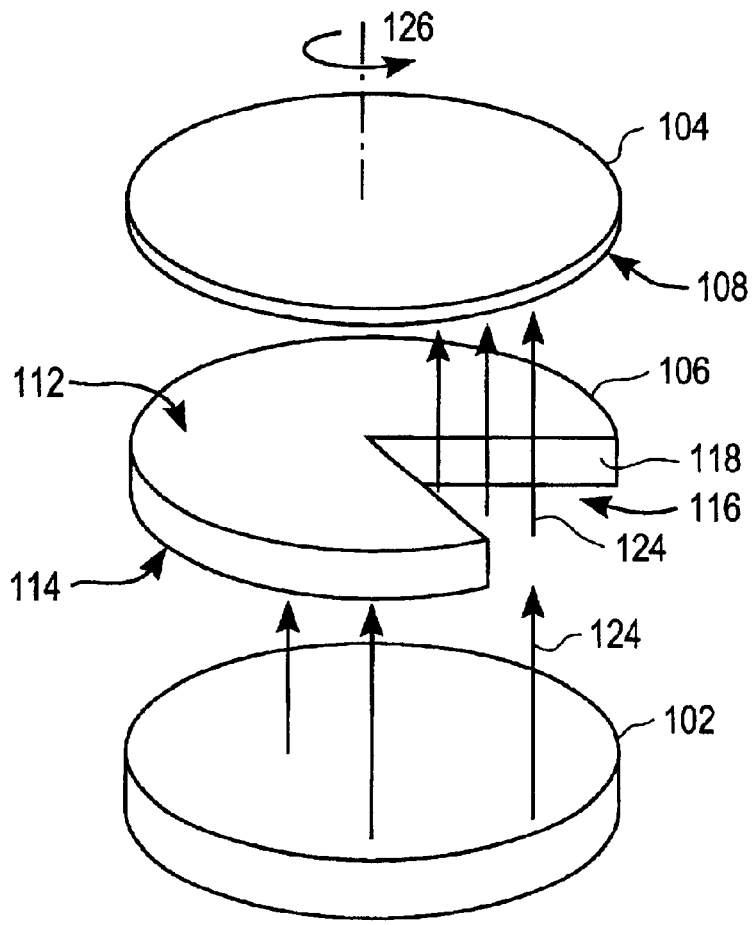
FIG. 3 illustrates a perspective view of a portion of the mask plate.

Reference will now be made to the drawings wherein like numerals refer to like parts throughout. An example of a planar electro deposition-polishing apparatus that can be used to practice the present invention is schematically shown in FIGS. 1–3. It should be noted that, in this application, process of electroetching, electropolishing, electrochemical etching are all used to refer to the process where a voltage is applied to a coating on a substrate in an electrolyte to remove part or all of the coating.

Descriptions of various methods and apparatus for electrodeposition of planar films can be found in the following patent and pending application, all commonly owned by the assignee of the present invention: U.S. Pat. No. 6,176,992 entitled "Method and Apparatus for Electrochemical Mechanical Deposition," U.S. application Ser. No. 09/740,701 entitled "Plating Method and Apparatus that Creates a Differential Between Additive Disposed on a Top Surface and a Cavity Surface of a Workpiece Using an External Influence," now U.S. Pat. No. 6,534,116, U.S. application Ser. No. 09/735,546 entitled "Method and Apparatus for Making Electrical Contact To Wafer Surface for Full-Face Electroplating or Electropolishing," now U.S. Pat. No. 6,482,307, and U.S. application Ser. No. 09/760,757 entitled "Method and Apparatus for Electrodeposition of Uniform Film with Minimal Edge Exclusion on Substrate," now U.S. Pat. No. 6,610,190. When used as an electropolishing system in a removal process, the anode and cathode become reversed, as described in U.S. Pat. No. 6,176,992 referred to above. When used for electrodeposition in a deposition process, the system of the Present invention can deposit a conductive material such as copper on a workpiece such as a semiconductor wafer. Although copper is used as an example material that is deposited and/or removed herein, the present invention may be used when depositing or removing other conductors, for example, Ni, Pd, Pt, Au, Pb, Sn, Ag and their alloys.

FIG. 1 schematically shows a portion of exemplary electro plating/etching system 100 that may be used for the present invention. The plating system 100 has an electrode 102, a workpiece 104 and a mask plate 106. A copper plating solution containing copper ions makes contact with the electrode 102 and the workpiece 104. In FIG. 1, although the electrode 102 is shown under the mask plate 106, it can be positioned anywhere in the system 100 as long as the electrode 102 makes contact with the plating solution. The workpiece 104 may be a substrate or wafer, preferably a silicon wafer portion. The workpiece 104 comprises a front surface 108 to be plated with copper and a back surface 110 to be held by a carrier head (not shown). The front surface 108 may comprise the features shown in FIG. 4. An exemplary copper plating solution may be a copper base solution such as a solution containing $CuSO_4$, $H_2SO_4$, $Cl^-$ and additives. The additives are generally chemicals called suppressors, accelerators, levelers and brighteners etc., which affect the grain size, morphology, and filling of the small features as well as smoothness of the deposited copper. Such additives are well known in the copper plating industry. The copper plating solution used in this invention may also comprise alternative additive chemistries. One such alternative additive chemistry is disclosed in the pending U.S. application Ser. No. 09/544,558 entitled "Modified Plating Solution for Plating and Planarization and Process Utilizing Same" which is commonly owned by the assignee of the present invention. Other alternative chemistries, agents can also be used with the plating solution of the present invention to affect the properties of the deposited material and are within the scope of this invention.

FIG. 2 illustrates a top view and FIG. 3 illustrates a perspective view of a portion of the workpiece surface influencing device or mask plate 106. The illustrated portion of the mask plate 106 comprises a top surface 112 and a bottom surface 114. The mask plate portion 106 also comprises a channel 116 extending between the top and the bottom surfaces 112, 114 and defined by a 'V' shaped sidewall 118 having a first wall 118a and a second wall 118b. The channel 116 laterally extends between a closed end 120 and an open end 122. The top surface 112 of the mask plate 106 may be abrasive or an abrasive pad material may be attached to it.

It should be noted that various channel/opening designs can be used for the mask plate 106. The "V" shape of the channel in FIG. 2 is just an example. Whatever the shape of the channels, it is, however, important to note that the mask plate 106 has openings such as channel 116 to allow the plating solution to flow through towards the workpiece 104. For the purpose of clarification, although only one channel is shown in FIG. 2, it is understood that there are typically multiple channels. Channels also exist in porous pads, as described in U.S. Pat. No. 6,176,992 referred to above. Accordingly, the term workpiece surface influencing device is used to collectively refer to such structures that are used to create an influence on the workpiece surface.

FIG. 3 exemplifies how the planar plating process through the channel 116 progresses as the workpiece 104 is rotated about the axis 126 on the mask plate 106 as described above. During an electroplating process, the front surface 108 of the workpiece 104 is brought into close proximity, or contact with, the top surface 112 of the mask plate 106 for metal deposition. As a plating solution, depicted by arrows 124, is delivered through the channel 116, the workpiece 104 is rotated about the axis 126 while the front surface 108 contacts the top surface 112 of the mask plate 106. As shown in FIG. 3, the axis 126 may run directly through the closed end 120 of the channel 116. As the solution is flowed through the channel 116, it makes contact with the front surface 108 of the workpiece 104. Under an applied potential between the workpiece 104 and the electrode 102 in the presence of the solution 124 that is flowed through the channel 116, copper is plated on the front surface 108 of the workpiece 104.

In one embodiment, the front surface 108 is also swept by the top surface 112 of the mask plate 106 during certain period of the plating process. The sweeping caused by the top surface 112 of the mask plate 106 assists in obtaining planar deposition of the metal. The solution 124, which is continuously delivered under pressure, will then flow through the channel 116 towards the open end 122 and exit the mask plate 106. During this process, mechanical polishing or sweeping with the mask plate 106 provides substantially flat deposition layers. During the mechanical sweeping, the workpiece 104 makes contact with the mask plate 106 with a pressure in the range of 0.1 psi to 5 psi, preferably 0.2 psi to 1 psi.

It is noted that the above description described rotation and movement of the workpiece 104, assumes that the mask plate 106 is stationary. It is understood that the system 100, as described above, will allow for either the workpiece 104 or the mask plate 106 to move, or for both of them to move, thereby creating the same relative affect. For ease of description, however, the invention will be described in terms of movement of the workpiece 104. Furthermore, the shape and form of the channel(s) 116 may be different. In addition to rotating, the workpiece 104 may also be moved laterally for better uniformity in coating. During the process, the workpiece 104 may be rotated in the range of 5 to 300 revolutions per minute (rpm), preferably 20 to 200 rpm while applying a lateral x-motion typically more than 1 centimeter (cm), preferably between 1 to 30 cm. Further, the velocity in the x-motion may be more than 0.1 millimeters per second (mm/s), and preferably between 1 to 30 mm/s. It should also be noted that FIGS. 1 to 3 only show portions of the system components. Therefore, the sizes and shapes of the each piece such as mask plate 106, electrode 102 are not meant to be limited to the sizes and shapes shown in the FIGS. 1 to 3.

Figure 4:
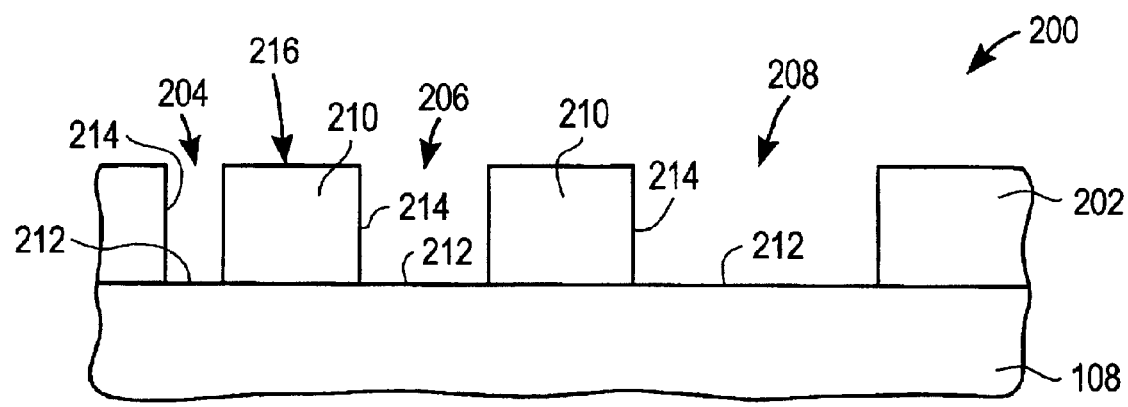
FIG. 4 shows a first structure, which is formed on the front surface of the workpiece shown in FIGS. 1 and 3.

The preferred process implementing this technology to elecroplate a workpiece surface is described below. FIG. 4 shows a first structure 200, which is formed on the front surface 108 of the workpiece 104 shown in FIGS. 1 and 3. The first structure 200 is comprised of a patterned layer 202, preferably an insulating layer such as silicon oxide, formed on a base layer 108, which is the top surface 108 of the workpiece 104. The first structure 200 may be formed using well known patterning and etching techniques pursuant to metal interconnect design rules. In this embodiment, the insulating layer 202 includes cavities or gaps, namely a first cavity 204, a second cavity 206 and a third cavity 208, separated from one another by interlayer regions 210. Each cavity 204, 206, 208 is defined by a bottom wall 212 and side walls 214. The thickness of the inter layer regions 210 is determined as the distance between the bottom wall 212, or the base layer 108 top surface and the top surface 216 of the inter layer regions 210. In this example, the thickness of the interlayer regions 210 is equal to the depth of the cavities 204, 206 and 208. The top surfaces 216 of the interlayer regions 210 are also called field regions.

In this embodiment, the cavities 204, 206, 208 can be formed such that the first cavity 204 may be a via or a narrow trench, the second cavity 206 may be a mid-size trench or a large via, and the third cavity 208 may be a trench or a large pad. In this respect, the first cavity 204 may have a width of less than 1 micrometers. The second cavity 206 may have a width of 1–5 micrometers, and the third cavity 208 may have a width of more than 5 micrometers. The depth of the cavities may be larger than 0.3 to 10 micrometers, but preferably 0.3–5 micrometers. At this point of the process, although not shown in the drawings, typically one or more thin layers of barrier or glue layer materials, for example, Ta, TaN, Ti, TiN, or WN can be deposited, using well known processes in the art, as a barrier or glue layer. Multiple layers of different barrier materials, such as bilayers formed with sequential deposition of Ta and TaN or Ti and TiN can also be constructed. Subsequently, a thin film of copper is deposited as the seed layer on top of the barrier layer for the subsequent electroplated copper layer. The copper seed layer provides a base layer on which nucleation and growth of the subsequent deposition layer can occur.

Figure 5:
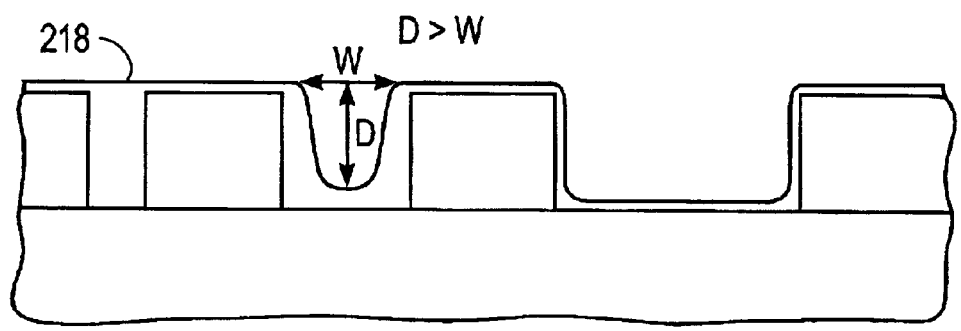
FIG. 5 illustrates a first layer deposited into the cavities and on the top surfaces of the workpiece.

Referring to FIG. 5, a first layer 218 is deposited into the cavities 204, 206, 208 and on the top surfaces 216. The deposition process is performed using the exemplary system 100 described above. It is known in the art that copper electroplating solutions are formulated with additives that promote bottom up plating in narrow features/cavities. When workpiece with various size features are coated with copper using these electrolytes, the small features, i.e., typically features that are smaller than 1 micrometer, are filled up easily and quickly with copper plating from the bottom of the cavity towards its top. Large features are coated in a conformal manner because additives can diffuse in and out of such features without impediment. Medium size features behave somewhat in between the two extremes.

In operation, as can be seen in FIG. 1, initially, the front surface 108 is plated without making contact with the mask plate 106, (i.e., the workpiece 104 is held in close proximity of the mask plate 106 and moved during the plating). During this stage of the process, the gap between the wafer front surface and the surface of the mask plate is preferably about 1–4 millimeters (mm). This process step will be referred to as "no-contact" plating hereinafter. Referring back to FIG. 5, at this stage of the process, the depositing material, which forms the first layer 218, fills the first cavity 204 completely through bottom-up filling process and covers the walls and the bottom of the third cavity 208 in a conformal fashion. Further, during the process, the material deposited into the second cavity 206 partially fills it in a somewhat bottom-up fashion. At this stage of the process, although a portion of the first layer 218 partially fills the second cavity 206 and makes it smaller, the remaining opening still maintains its high aspect ratio (depth D/width W), (i.e., D>W). It is understood that the second cavity 206 may be any cavity that is partially filled and that can be used to determine if the D>W condition exist. The no-contact plating may be continued as long as D>W condition exists in any of the cavities. Preferably, contact plating may not be initiated as long as the D>W condition exists. As will be described below, if the contact plating is initiated with D>W condition existing, defects may form.

Figure 6A:
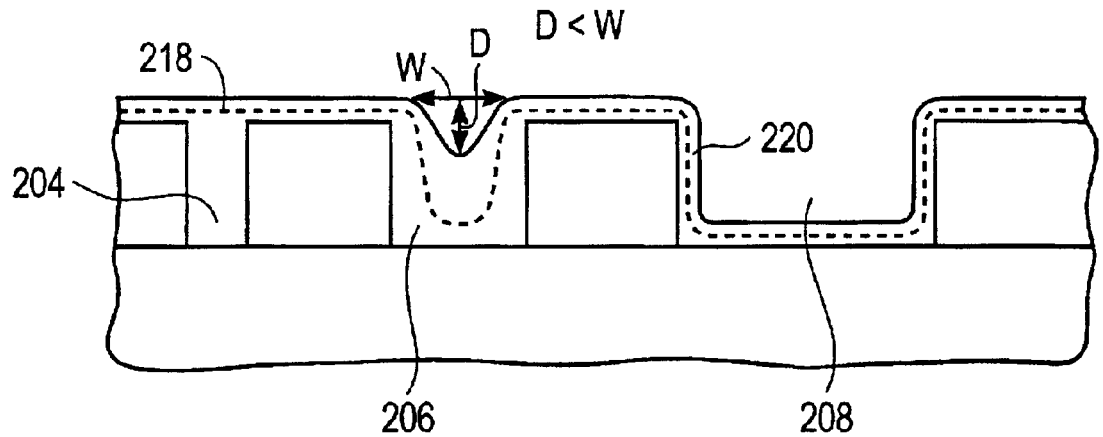
FIGS. 6A, 6B and 7 illustrate various profiles that can be achieved.
Figure 6B:
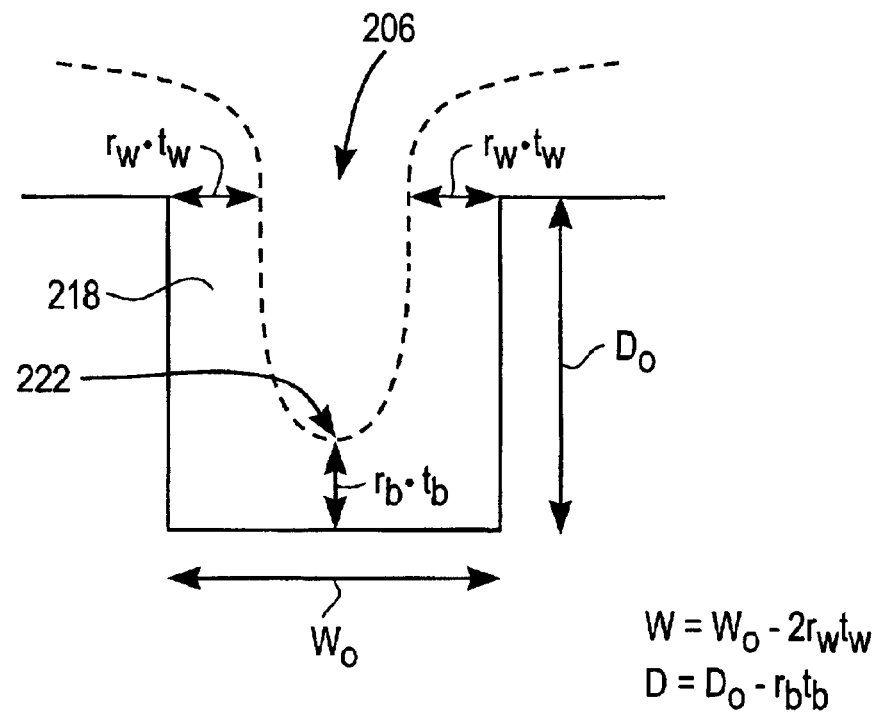
Figure 7:
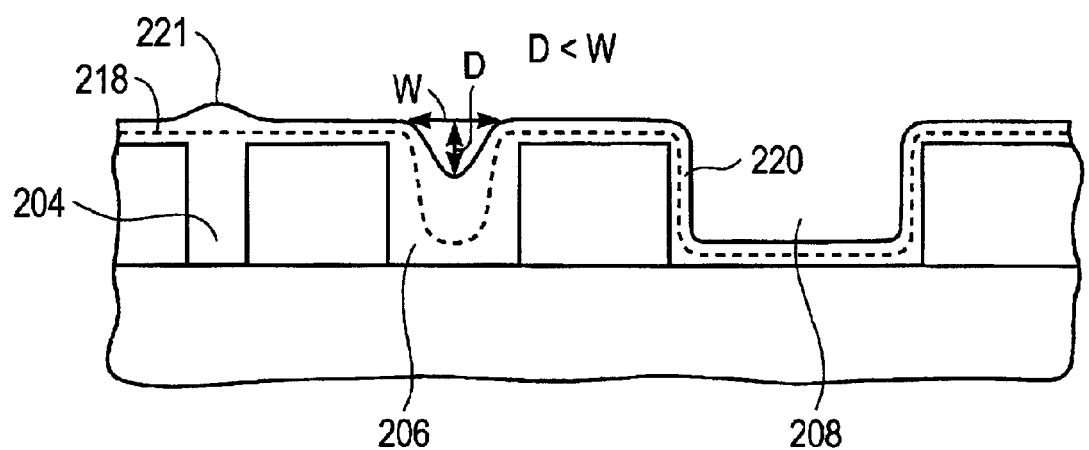

Accordingly, as shown in FIGS. 6A and 7, depending on the process parameters used, no contact plating may result in a second layer 220 having two types of surface profile, namely flat profile (FIG. 6A) and overfill profile (FIG. 7) respectively. In the preferred flat profile, as shown in FIG. 6A, as the no-contact plating process is continued and the second layer 220 is coated on the first layer 218, the aspect ratio of the second cavity 206 is smaller such that the width W of the cavity becomes larger than the depth D. That is, W>D condition exists. This condition may also be expressed in terms of the thickness of the selected regions of the deposited layer and the corresponding growth rate for that selected thickness value. As shown in FIG. 6B, if $r_b$ is the growth rate from the bottom wall of the second cavity 206 and $r_w$ is the growth rate from the top of the side walls of the second cavity 206, the above given condition W>D can also be expressed approximately as $W_0 - 2r_w t > (D_0 - r_b t)$, where $W_0$ and $D_0$ are the initial width and the depth of the cavity before the deposition, and t is the deposition time. It should be noted that the barrier and seed layers are not shown in any of the figures for the purpose of clarification.

Referring to the case of overfill profile (FIG. 7), as the no-contact plating fills the first cavity 204 an overfill feature 221 such as a bump may form above the first cavity 204. During the copper plating process, such bumps are possible and formed due to the overfilling of the cavities. Although mechanism is not fully understood, it is believed that such bumps form due to preferential or accelerated adsorption of growth accelerating additive species in the small cavities. In such morphologies, due to the existence of the bump 221, in the subsequent contact plating stage, as opposed to the case of the flat profile, a thick deposition layer is required to fill the cavities 206, 208 and to cover the bump 221. This is time consuming and reduces system efficiency. Therefore, the flat profile is the preferred surface profile in this embodiment. However, if the bumps are formed, the second step of the process eliminates them by planarizing the surface.

Referring back to FIG. 6A, flatness of the second layer 220 may be obtained using various techniques such as using flatness enhancing agents in the electrolyte solution or using a pulse power supply to energize the anode and the cathode. Flatness enhancing agents may be exemplified as levelers. Levelers are well known chemicals in the electroplating technology and used to effectively suppress the growth of bumps on the depositing layers. A pulse power supply or a variable voltage power supply can also minimize or eliminate the over fill bump. A technique called reverse pulse plating process may be used to obtain flat surface profiles over small features. In this approach, the voltage pulses make the workpiece surface periodically cathodic to deposit copper on it and anodic for a shorter time to etchback a portion of the deposited material so that flatness of the layer can be achieved. The pulse power supply can also be used during the second step or the contact plating and third step or the electroetching step of the process of the present invention. Referring back to FIGS. 6A and 6B, once the $W_0-2r_w t > (D_0-r_b t)$ condition is satisfied for all the remaining features (i.e., the mid-size and the large features), the process is continued with the "contact" plating stage of the process, or a second stage of the process, to completely fill the cavities. At the "contact" plating stage of the process, the front surface 108 is contacted to the top surface 112 of the mask plate 106, while the deposition process continues. If the contact plating is initiated without satisfying the W>D condition, defects may form.

Figure 8A:
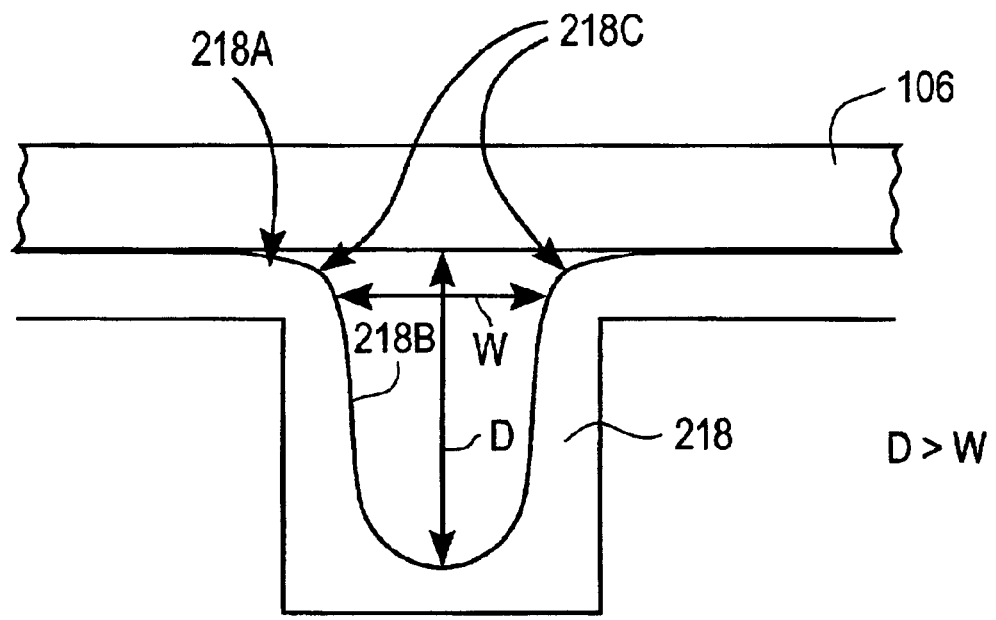
FIGS. 8A and 8B illustrate formation of defects.
Figure 8B:
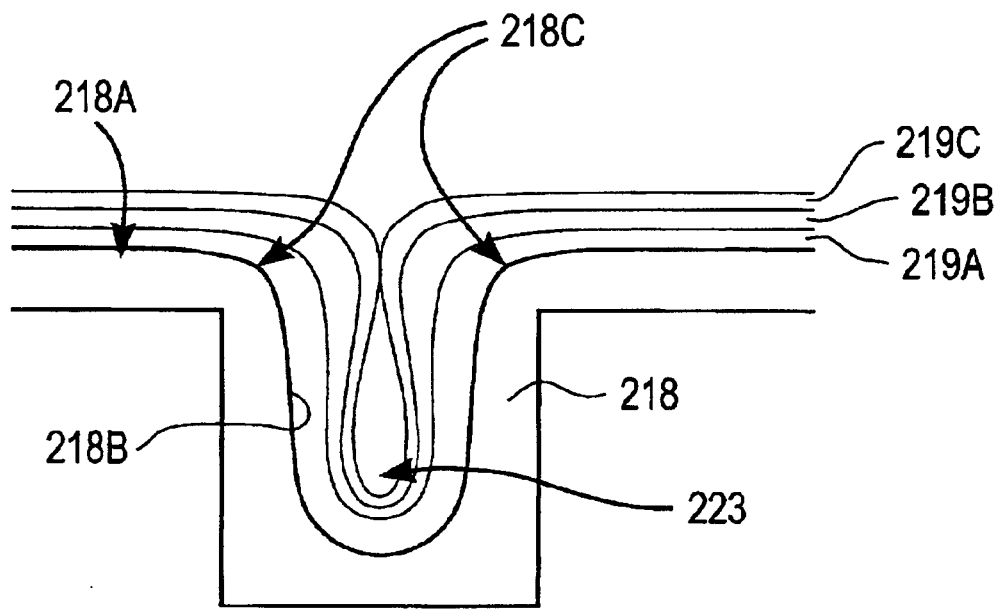

FIGS. 8A and 8B exemplifies formation of such defects. As shown in FIG. 8A, when the contact plating is initiated the mask plate 106 sweeps or mechanically influences the top portion 218A of the layer 218 but not an inner portion 218B and a mouth portion 218C covering the second cavity 206 side walls and the bottom wall. This in turn reduces the growth rate at the top portion 218A in comparison to both the inner portion 218B and the mouth portion 218C. Further the mechanical influence increases lateral growth rate of the copper at the mouth portion 218C in comparison to the inner portion 218B since it creates an additive differential between the inner portion 218B. This situation can be seen in FIG. 8B where as consecutive layers 219A, 219B, 219C are coated with contact plating, the layers 219A–219C grow faster at locations covering the mouth portion 218C than the inner portion 218B. Portions of the layers 219A–219C covering the top portion 218A grow slowly due to the mechanical influence created by the contacting mask plate. Such non-conformal growth pattern eventually forms a defect 223, often a hole, entrapping electrolyte solution which is an unwanted situation in electroplating.

Figure 9:
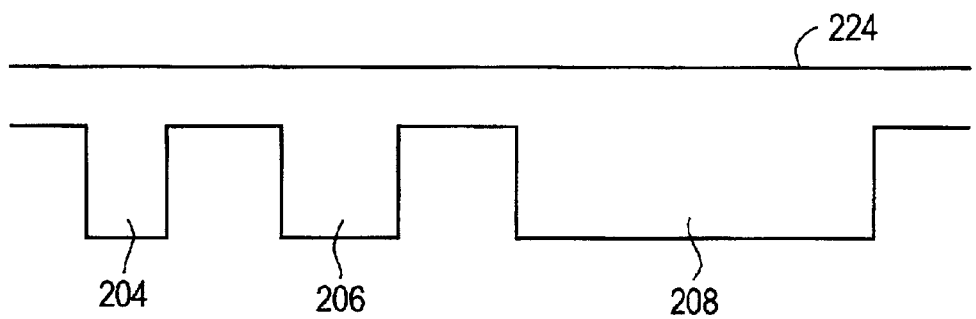
FIG. 9 illustrates further planarizing the growing deposition layer.

As shown in FIG. 9, the mechanical influence created by the contacting mask plate 106 further planarizes the growing deposition layer, and if the overfill profile is used, the mechanical influence removes the bump 221 as well (see FIG. 7). This results in a third deposition layer 224, which is a substantially planarized layer, on the workpiece 104. The contact step of the process may proceed in such manner that the workpiece 104 may make contact with the mask plate 106 intermediately (i.e., in a discontinuous fashion). This still results in planarized layer and smoothes the top layer. Further, such contact and no-contact action may be repeated multiple times.

Figure 10:
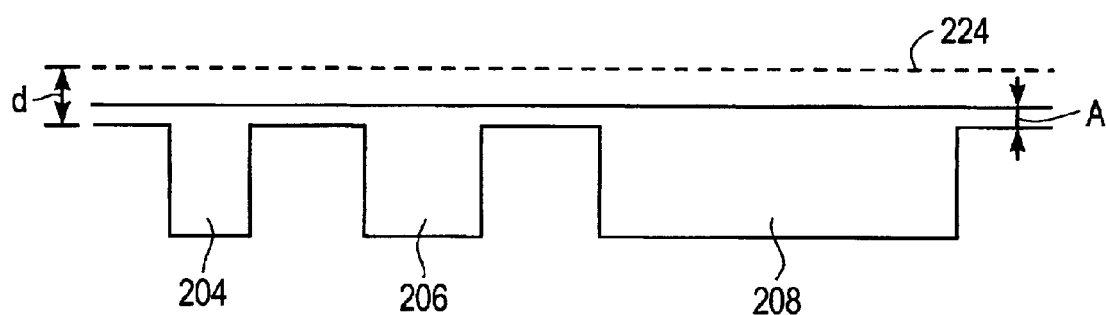
FIG. 10 illustrates a profile when a no-contact electroetching process is used.
Figure 11:
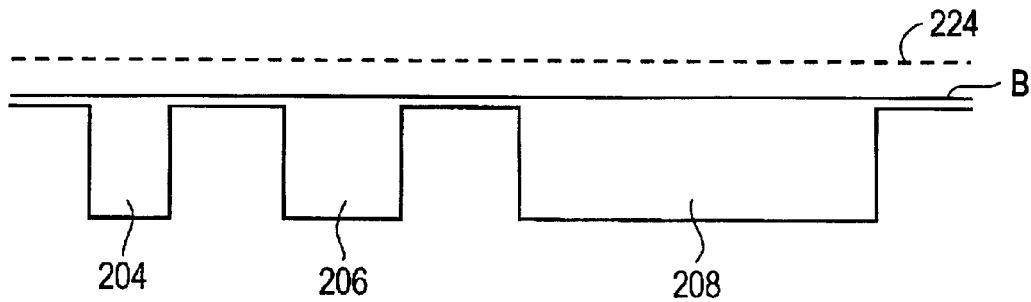
FIG. 11 illustrates a profile when a contact electroetching process is further used.

In the following stage of the process, by reversing the polarization of the electrodes (i.e., by applying negative potential to anode electrode and by applying positive potential to the workpiece), the layer 224 can be electroetched down to a predetermined thickness over the interlayer regions. In this third step, electroetching process may be performed using the same electrolyte solution used during the electrodeposition stage and using the same system above. As in the case of electrodeposition, the electroetching may be also carried out by "no-contact" electroetching and "contact" electroetching process steps. Accordingly, as illustrated in FIG. 10, with the no-contact electroetching process, thickness 'd' of the layer 224 can be reduced down to thickness A in a planar manner. As illustrated in FIG. 11, with the application of the contact electroetching process, contacting mask plate 106 reduces the thickness of the layer 224 in a planar fashion, down to thickness B.

Contact and no-contact electroetching can be used sequentially and multiple times using the same or different process parameters such as by employing different current levels, different wafer pressure levels and different rotational and lateral velocities. If contact and no-contact electroetching processes are performed in a multiple fashion, the process may be terminated with contact electroetching process. As mentioned above, the contact step smoothes the layer. The thickness B may be less than the depth $D_0$ of the cavities 204, 206 and 208, and preferably less than half of the depth ($D_0/2$) of the cavities. The third step of the process may be performed in the same electrolyte or solution that is used for the deposition process. Further, this step may be performed in the same process module that the deposition is carried out and subsequent to the deposition process.

Figure 12:
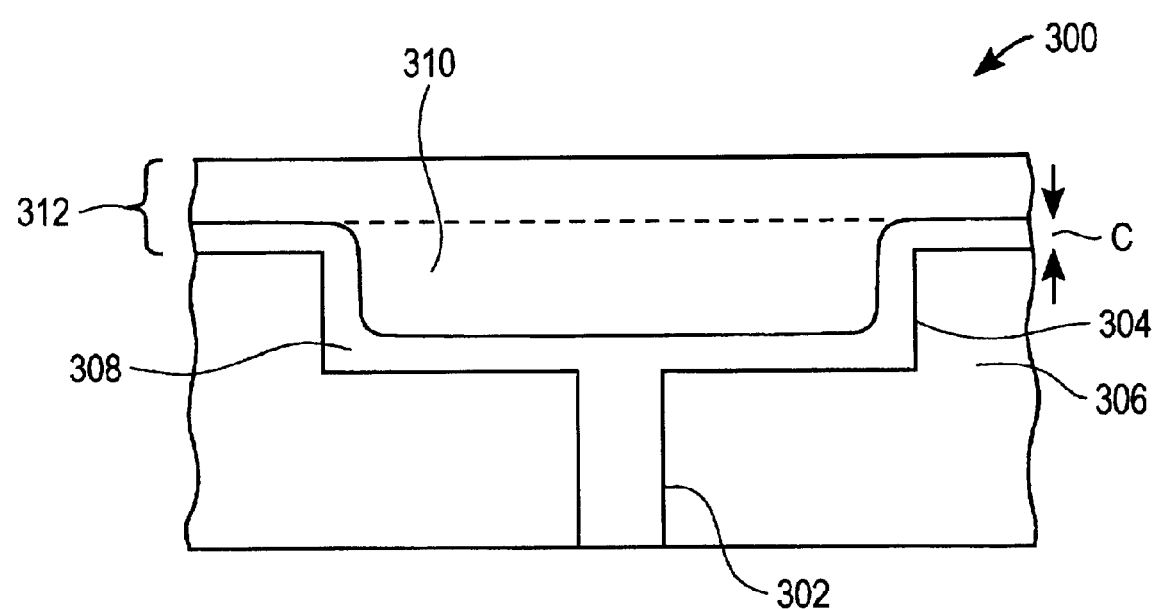
FIG. 12 illustrates a dual damascene structure getting filled with a conductor.

The method of the above embodiment can fill cavities of any shape and form. One example, a dual damascene structure 300, is shown in FIG. 12. The dual damascene structure 300 has a via 302 and a trench 304 formed in an insulator 306. The via 302 may be a narrow via, and the trench 304 may be a mid size or a larger trench. If the above process is used, in the first step of the process or no contact step, the depositing material fills the via 302 and conformally coats the trench 304 with a first layer 308. In a second step, or contact step, the depositing material fills the trench completely with a second layer 310 and the mechanical influence created by the contacting mask plate 106 planarizes the growing second layer 310. In the third step, a layer 312 that is formed by sequentially depositing layers 308 and 310 is electroetched down to a predetermined thickness "C" as shown in FIG. 12.

Although various preferred embodiments have been described in detail above, those skilled in the art will readily appreciate that many modifications of the exemplary embodiment are possible without materially departing from the novel teachings and advantages of this invention.

What is claimed is:

1. An electrochemical processing method for operating upon a wafer, the wafer having a top surface with first and second cavities disposed thereon, the first cavity having a narrower width than the second cavity, and a conductive layer having a conductive top surface associated therewith disposed on the top surface of the wafer and on the first and second cavities, the method comprising:

performing electrochemical deposition on the conductive layer of the wafer to result in at least the first cavity being at least partially filled with conductive material; and performing electrochemical mechanical deposition on the conductive layer of the wafer in which the first cavity is at least partially filled with more conductive material to result in at least some of any remaining cavity within the first and second cavities being further filled with more conductive material, wherein physical contact and relative motion is maintained between the conductive top surface of the conductive layer disposed over the top surface of the wafer and a workpiece surface influencing device for at least a period of the electrochemical mechanical deposition.

2. The method according to claim 1 wherein the step of performing electrochemical deposition and the step of performing electrochemical mechanical deposition use a same electrolyte solution.

3. The method according to claim 1 wherein the steps of performing electrochemical deposition and performing electrochemical mechanical deposition are performed in a same process module.

4. The method according to claim 3, wherein during at least a substantial period of the electrochemical deposition, deposition occurs without physical contact between the wafer and the workpiece surface influencing device.

5. The method according to claim 4, wherein during the substantial period the electrochemical deposition occurs with the workpiece surface influencing device spaced a distance from the wafer, thereby allowing for the workpiece surface influencing device to operate as a shaping plate.

6. The method according to claim 3 wherein the step of performing electrochemical deposition occurs so that during substantially an entire period thereof the electrochemical deposition occurs without physical contact between the wafer and the workpiece surface influencing device.

7. The method according to claim 6 wherein during substantially an entire period that the step of performing electrochemical mechanical deposition is performed the physical contact and the relative motion is maintained between the conductive top surface of the conductive layer disposed over the top surface of the wafer and the workpiece surface influencing device.

8. The method according to claim 1 wherein during substantially an entire period that the step of performing electrochemical mechanical deposition is performed the physical contact and the relative motion is maintained between the conductive top surface of the conductive layer disposed over the top surface of the wafer and the workpiece surface influencing device.

9. The method according to claim 8 wherein the step of performing electrochemical deposition occurs so that during an entire period of the electrochemical deposition, deposition occurs without physical contact between the wafer and any workpiece surface influencing device.

10. The method according to claim 1 wherein the step of performing electrochemical deposition minimizes the formation of a conductive bump formed over the first cavity by applying a reverse pulse potential.

11. The method according to claim 1 wherein the step of performing electrochemical mechanical deposition results in the conductive top surface of the conductive layer being planar and each of the first and second cavities being completely filled.

12. The method according to claim 1 wherein the step of performing electrochemical deposition is performed until a depth of the first cavity is less than the width of the first cavity.

13. The method according to claim 1, further comprising the step of performing electrochemical etching of the conductive layer after the step of performing electrochemical mechanical deposition.

14. The method according to claim 13 wherein during at least a period during the step of electrochemical etching, the electrochemical etching occurs without physical contact between the wafer and the workpiece surface influencing device.

15. The method according to claim 13 wherein the step of performing electrochemical etching of the conductive layer uses electrochemical mechanical etching and during the step of performing electrochemical mechanical etching physical contact and relative motion is maintained between the conductive top surface of the conductive layer disposed over the top surface of the wafer and the workpiece surface influencing device for at least a period of the electrochemical mechanical etch.

16. The method according to claim 13 wherein the step of performing electrochemical etching uses an electrolyte solution that is also used during the steps of performing electrochemical deposition and performing electrochemical mechanical deposition.

17. The method according to claim 1 wherein, after the step of performing electrochemical mechanical deposition, repeating at least one of the steps of performing electrochemical deposition and performing electrochemical mechanical deposition until the any remaining cavity portion of the first and second cavities are completely filled with the conductive material.

18. The method according to claim 1 wherein the conductive material is copper.

19. The method according to claim 1 wherein, during the step of performing electrochemical mechanical deposition, the relative motion between the conductive top surface of the conductive layer disposed over the top surface of the wafer and the workpiece surface influencing device includes rotational motion.

20. The method according to claim 19 wherein, during the step of performing electrochemical mechanical deposition, the relative motion between the conductive top surface of the conductive layer disposed over the top surface of the wafer and the workpiece surface influencing device includes lateral motion.

21. The method according to claim 20 wherein, during the step of performing electrochemical mechanical deposition, the workpiece surface influencing device is fixed in a stationary position.

22. The method according to claim 19 wherein, during the step of performing electrochemical mechanical deposition, the workpiece surface influencing device is fixed in a stationary position.

* * * * *

UNITED STATES PATENT AND TRADEMARK OFFICE
CERTIFICATE OF CORRECTION

PATENT NO.        : 6,946,066 B2
APPLICATION NO.   : 10/201604
DATED             : September 20, 2005
INVENTOR(S)       : Bulent M. Basol et al.

Page 1 of 1

It is certified that error appears in the above-identified patent and that said Letters Patent is hereby corrected as shown below:

At Column 1, Line 6, delete "No," and insert --No--, therefor.

At Column 3, Line 24, delete "Present" and insert --present--, therefor.

At Column 5, Line 7, delete "elecroplate" and insert --electroplate--, therefor.

At Column 9, Line 5, in Claim 5, delete "4," and insert --4--, therefor.

Signed and Sealed this

Fifteenth Day of June, 2010

David J. Kappos
*Director of the United States Patent and Trademark Office*